(12) United States Patent
Myong

(10) Patent No.: US 8,642,115 B2
(45) Date of Patent: Feb. 4, 2014

(54) PHOTOVOLTAIC DEVICE AND MANUFACTURING METHOD THEREOF

(75) Inventor: Seung-Yeop Myong, Seoul (KR)

(73) Assignee: Kisco (KR)

( * ) Notice: Subject to any disclaimer, the term of this patent is extended or adjusted under 35 U.S.C. 154(b) by 649 days.

(21) Appl. No.: 12/762,798

(22) Filed: Apr. 19, 2010

(65) Prior Publication Data

US 2010/0313948 A1    Dec. 16, 2010

(30) Foreign Application Priority Data

Jun. 12, 2009 (KR) ................. 10-2009-0052236

(51) Int. Cl.
*B05D 1/12*   (2006.01)

(52) U.S. Cl.
USPC ............................................. 427/74

(58) Field of Classification Search
USPC ............................................. 427/74
See application file for complete search history.

(56) References Cited

U.S. PATENT DOCUMENTS

| | | | |
|---|---|---|---|
| 5,604,133 A * | 2/1997 | Aoike | 438/96 |
| 7,259,321 B2 * | 8/2007 | Oswald et al. | 136/244 |
| 7,405,521 B2 * | 7/2008 | Dhindsa et al. | 315/111.21 |
| 2003/0020018 A1 * | 1/2003 | Hwang et al. | 250/338.4 |
| 2003/0044539 A1 * | 3/2003 | Oswald | 427/404 |
| 2008/0202581 A1 * | 8/2008 | Kempa | 136/252 |
| 2009/0308453 A1 * | 12/2009 | Roca I Cabarrocas et al. | 136/258 |
| 2010/0047473 A1 * | 2/2010 | Roca I Cabarrocas et al. | 427/575 |
| 2010/0258169 A1 * | 10/2010 | Sheng et al. | 136/255 |
| 2011/0114177 A1 * | 5/2011 | Yang et al. | 136/258 |

FOREIGN PATENT DOCUMENTS

| | | |
|---|---|---|
| JP | 1986115319 | 6/1986 |
| JP | 1993110123 | 4/1993 |
| JP | 1999261102 | 9/1999 |
| JP | 2006295060 | 10/2006 |
| WO | WO 2008/074875 * | 6/2008 |
| WO | 2008078471 | 7/2008 |
| WO | 2008156337 | 12/2008 |

OTHER PUBLICATIONS

Low degradation and fast annealing effects of amorphous silicon multilayer processed through alternate hydrogen dilution, Kyung Hoon Jun et al., Journal of Applied Physics vol. 88, No. 8 Oct. 15, 2000, pp. 4881-4888.

Natural hydrogen treatment effect during formation of double amorphous silicon-carbide p layer structures producing high-efficiency pin-type amorphous silicon solar cells, Seung Yeop Myong et al., Applied Physics Letters 86, 033506, 2005, pp. 033506-1-033506-3.

(Continued)

*Primary Examiner* — Michael Cleveland
*Assistant Examiner* — Austin Murata
(74) *Attorney, Agent, or Firm* — The Belles Group. P.C.

(57) ABSTRACT

A photovoltaic device with a low degradation rate and a high stability efficiency. In one aspect, the photovoltaic device includes: a substrate; a first electrode disposed on the substrate; at least one photoelectric transformation layer disposed on the first electrode, the photoelectric transformation layer including a light absorbing layer; and a second electrode disposed on the photoelectric transformation layer; and wherein the light absorbing layer included in at least the one photoelectric transformation layer includes a first sub-layer and a second sub-layer, each of which includes hydrogenated amorphous silicon based material and a crystalline silicon grain respectively.

24 Claims, 7 Drawing Sheets

(56) References Cited

OTHER PUBLICATIONS

Highly stabilizedprotocrystalline silicon multilayer solar cell using a silicon—carbide double p-layer structure, Seung Yeop Myong et al., Solar Energy Materials & Solar Cells 85 (2005) pp. 133-140.

Double amorphous silicon-carbide p-layer structures producing highly stabilized pin-type protocrystailine silicon multilayer solar cells, Seung Yeop Myong et al., Applied Physics Letters 87, 193509, 2005, pp. 193509-1-193509-3.

Development of a rapidly stabilized protocrystalline silicon multilayer solar cell, Seung Yeop Myong et al., Semicond. Sci. Technol. 21 (2006), pp. L11-L15.

Inclusion of nanosized silicon grains in hydrogenated protocrystalline silicon multilayers and its relation to stability, Seung Yeop Myong et al., Applied Physics Letters 88, 083118, 2006, pp. 083118-1-083118-3.

Good Stability of Protocrystalline Silicon Multilayer Solar Cells Against Light Irradiation Originating From Vertically Regular Distribution of Isolated NANO-Sized Silicon Grains, Seung Yeop Myong et al., 1-4244-0016-3/06, 2006, IEEE, pp. 1584-1587.

Degradation Behavior of Nanostructure Tailored Si Solar Cells Fabricated by Alternatey Hydrogenated Dilution Method, M. Ito et al., Technical Digest of the International PVSEC-14, Bangkok, Thailand 2004 LP1-030, pp. 381-382.

Systematic Study of Photodegradation of Tailored Nanostructure Si Solar Cells by Controlling Their Medium Range Order, Manabu Ito et al., Japanese Journal of Applied Physics vol. 45, No. 8, 2006, pp. L230-L232.

Preparation of Nanocrystaltine Silicon in Amorphous Siticon Carbide Matrix, Yasuyoshi Kurokawa et al., Japanese Journal of Applied Physics vol. 45, No. 40, 2006, pp. L1064-L1066.

\* cited by examiner

PHOTOVOLTAIC DEVICE AND MANUFACTURING METHOD THEREOF

CROSS-REFERENCE TO RELATED APPLICATION

This application claims the benefit of Korean Patent Application No. 10-2009-0052236, filed on Jun. 12, 2009, the entirety of which is hereby incorporated by reference.

FIELD OF THE INVENTION

This application relates to a photovoltaic device and a manufacturing method thereof.

BACKGROUND OF THE INVENTION

Recently, as existing energy sources such as oil and charcoal and so on are expected to be exhausted, attention is now paid to alternative energy sources which can be used in place of the existing energy sources. Among the alternative energy sources, sunlight energy is most abundant and has no environmental pollution. For this reason, more and more attention is paid to the sunlight energy.

A photovoltaic device or a solar cell converts sunlight energy directly into electrical energy. In performing this conversion, the photovoltaic device uses mainly the photovoltaic effect of a semiconductor junction. In other words, when light is incident and absorbed to a semiconductor p-n junction formed through a doping process by means of p-type and n-type impurities respectively, light energy generates electrons and holes at the inside of the semiconductor. Then, the electrons and the holes are separated by an internal field so that a photo-electro motive force is generated at both ends of the p-n junction. Here, if electrodes are formed at the both ends of junction and connected with wires, an electric current flows externally through the electrodes and the wires.

In order to substitute the existing energy sources such as oil with a sunlight energy source, it is required that a degradation rate of the photovoltaic device be low and a stability efficiency of the photovoltaic device be high. This low degradation rate and high stability efficiency are produced by the elapse of time.

SUMMARY OF THE INVENTION

One aspect of this invention includes a photovoltaic device. The photovoltaic device includes: a substrate; a first electrode disposed on the substrate; at least one photoelectric transformation layer disposed on the first electrode, the photoelectric transformation layer including a light absorbing layer; and a second electrode disposed on the photoelectric transformation layer; and wherein the light absorbing layer included in at least the one photoelectric transformation layer includes a first sub-layer and a second sub-layer, each of which includes hydrogenated amorphous silicon based material and a crystalline silicon grain respectively.

One aspect of this invention includes a method of manufacturing a photovoltaic device. The method includes: forming a first electrode on a substrate; forming at least one photoelectric transformation layer on the first electrode in a chamber, the photoelectric transformation layer including a light absorbing layer; forming a second electrode on the photoelectric transformation layer; wherein a hydrogen dilution ratio of each of source gases which are introduced to the chamber is constant while the light absorbing layer is formed; and wherein, while the light absorbing layer is formed, a first voltage having a first frequency and a second voltage having a second frequency higher the first frequency are alternately supplied to an electrode having a nozzle formed therein in the chamber; or wherein, while the light absorbing layer is formed, the first voltage is continuously supplied to the electrode and the second voltage is alternately supplied to the electrode.

BRIEF DESCRIPTION OF THE DRAWINGS

The embodiment will be described in detail with reference to the following drawings.

DETAILED DESCRIPTION OF THE INVENTION

Embodiments will be described in a more detailed manner with reference to the drawings.

Figure 1:
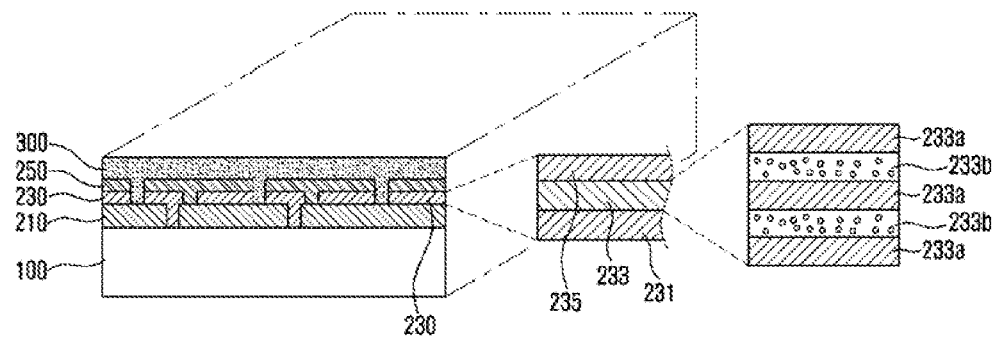
FIG. 1 shows a photovoltaic device according to a first embodiment of the present invention.

FIG. 1 shows a photovoltaic device according to a first embodiment of the present invention.

As shown, a photovoltaic device includes a substrate 100, a first electrode 210, a second electrode 250, a photoelectric transformation layer 230 and a protecting layer 300.

In detail, the first electrodes 210 are disposed on the substrate 100. The first electrodes 210 are spaced from each other at regular intervals in such a manner that adjacent first electrodes are not electrically short-circuited. The photoelectric transformation layer 230 is disposed on the first electrode 210 in such a manner as to cover the spaces between the adjacent first electrodes 210. The second electrodes 250 are disposed on the photoelectric transformation layer 230 and spaced from each other at regular intervals in such a manner that adjacent second electrodes 250 are not electrically short-circuited. In this case, the second electrode 250 penetrates the photoelectric transformation layer 230 and is electrically connected to the first electrode 210 such that the second electrode 250 is connected in series to the first electrode 210. The adjacent photoelectric transformation layers 230 are spaced at the same interval as the interval between the second electrodes 250. The protecting layer 300 is disposed on the second electrode 250 in such a manner as to cover the area spaced between the second electrodes 250 and the area spaced between the photoelectric transformation layers 230.

The photoelectric transformation layer 230 includes a p-type semiconductor layer 231, a light absorbing layer 233 and an n-type semiconductor layer 235. The light absorbing layer 233 includes a first sub-layer 233A and a second sub-layer 233B stacked on the first sub-layer 233A. The first sub-layer 233A includes a hydrogenated amorphous silicon based material and the second sub-layer 233B includes a crystalline silicon grain.

Figure 2:
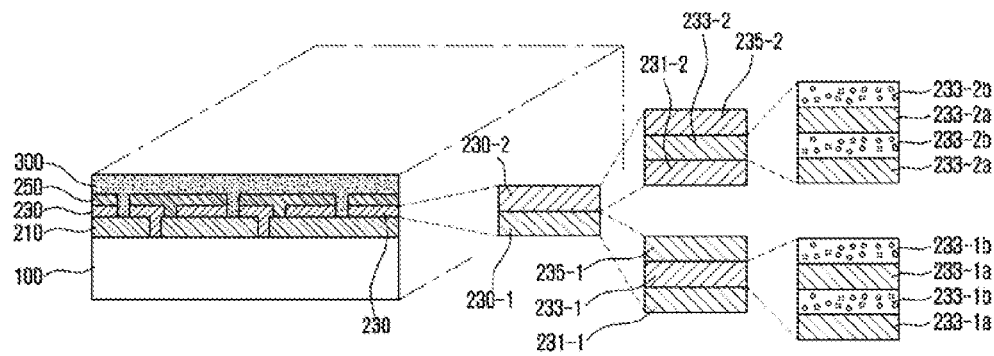
FIG. 2 shows another photovoltaic device according to a second embodiment of the present invention.

FIG. 2 shows another photovoltaic device according to a second embodiment of the present invention.

Since a photovoltaic device of FIG. 2 is almost similar to that of FIG. 1, descriptions of the same structure will be omitted. In FIG. 2, the photoelectric transformation layer 230 includes a first photoelectric transformation layer 230-1 and a second photoelectric transformation layer 230-2 disposed on the first photoelectric transformation layer 230-1. The first photoelectric transformation layer 230-1 and the second photoelectric transformation layer 230-2 include p-type semiconductor layers 231-1 and 231-2, light absorbing layers 233-1 and 233-2 and n-type semiconductor layers 235-1 and 235-2.

The light absorbing layers 233-1 and 233-2 include first sub-layers 233-1A and 233-2A and second sub-layers 233-1B and 233-2B stacked on the first sub-layers 233-1A, 233-2A. Here, the light absorbing layer 233-1 included in the first photoelectric transformation layer 230-1 includes the first sub-layer 233-1A and the second sub-layer 233-1B. The first sub-layer 233-1A includes the hydrogenated amorphous silicon based material and the second sub-layer 233-1B includes a crystalline silicon grain. The light absorbing layer 233-2 included in the second photoelectric transformation layer 230-2 includes the first sub-layer 233-2A and the second sub-layer 233-2B. The first sub-layer 233-2A includes hydrogenated micro-crystalline silicon germanium and the second sub-layer 233-2B includes hydrogenated micro-crystalline silicon.

While only two photoelectric transformation layers are provided in the present embodiment, three or more photoelectric transformation layers can be also provided. Regarding a second photoelectric transformation layer or a third photoelectric transformation layer among three photoelectric transformation layers, which is far from a side of incident light, the second photoelectric transformation layer or the third photoelectric transformation layer can include a light absorbing layer including a first sub-layer and a second sub-layer. The first sub-layer includes hydrogenated micro-crystalline silicon germanium and the second sub-layer includes hydrogenated micro-crystalline silicon.

With respect to such photovoltaic devices according to the first and the second embodiments, a method of manufacturing the photovoltaic device will be described below in more detail.

FIGS. 3A to 3H show a manufacturing method of a photovoltaic device according to an embodiment of the present invention.

Figure 3A:
FIGS. 3A to 3H show a manufacturing method of a photovoltaic device according to an embodiment of the present invention.

As shown in FIG. 3A, a substrate 100 is provided first. An insulating transparent substrate 100 can be used as the substrate 100.

Figure 3B:
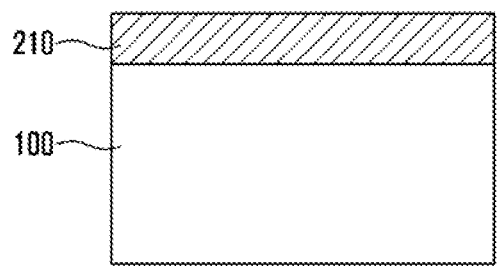

As shown in FIG. 3B, a first electrode 210 is formed on the substrate 100. In the embodiment of the present invention, the first electrode 210 can be made by chemical vapor deposition (CVD) or be made of transparent conductive oxide (TCO) such as $SnO_2$ or $ZnO$.

Figure 3C:
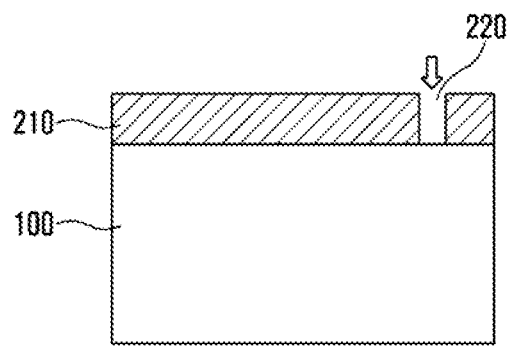

As shown in FIG. 3C, a laser beam is irradiated onto the first electrode 210 or the substrate 100 so that the first electrode 210 is partially removed. As a result, a first separation groove 220 is formed. In other words, the first separation groove 220 penetrates the first electrode 210, thereby preventing adjacent first electrodes from being short-circuited.

Figure 3D:
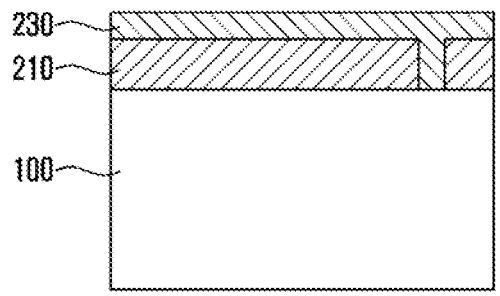

As shown in FIG. 3D, at least one photoelectric transformation layer 230 including a light absorbing layer is stacked by CVD in such a manner as to cover the first electrode 210 and the first separation groove 220. In this case, each photoelectric transformation layer 230 includes a p-type semiconductor layer, a light absorbing layer and an n-type semiconductor layer. In order to form the p-type semiconductor layer, source gas including silicon, for example, $SiH_4$ and source gas including group 3 elements, for example, $B_2H_6$ are mixed in a reaction chamber, and then the p-type semiconductor layer is formed by CVD. Then, the source gas including silicon is introduced to the reaction chamber so that the light absorbing layer is formed on the p-type semiconductor layer by CVD. In a preferred embodiment, introduction of the source gas into the reaction chamber involves flowing the source gas into the chamber. A method of manufacturing the light absorbing layer will be described in detail below. Finally, reaction gas including a group 5 element, for example, $PH_3$; and source gas including silicon are mixed, and then the n-type semiconductor layer is stacked on an intrinsic semiconductor by CVD. Accordingly, the p-type semiconductor layer, the light absorbing layer and the n-type semiconductor layer are stacked on the first electrode 210 in that order.

The light absorbing layer according to the embodiment of the present invention can be included in a single junction photovoltaic device including one photoelectric transformation layer 230 or in a multiple junction photovoltaic device including a plurality of photoelectric transformation layers.

Figure 3E:
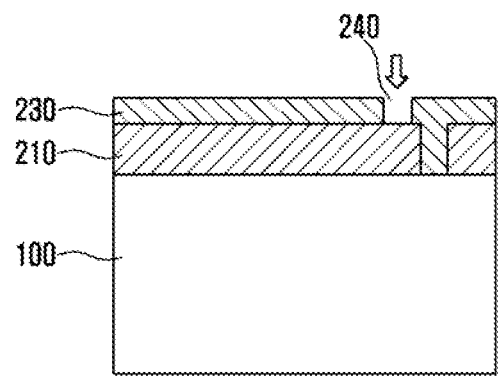

As shown in FIG. 3E, a laser beam is irradiated from the air onto the substrate 100 or the photoelectric transformation layer 230 so that the photoelectric transformation layer 230 is partially removed. A second separation groove 240 is thereby formed in the photoelectric transformation layer 230.

Figure 3F:
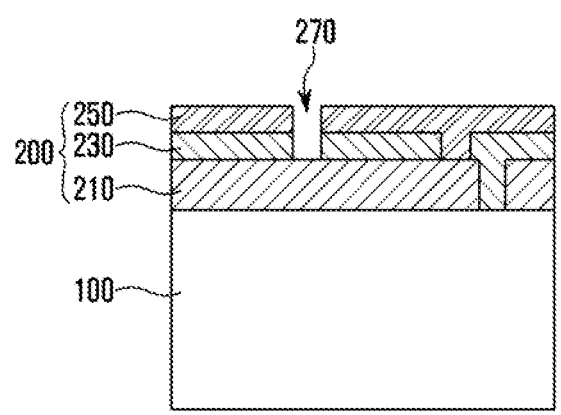

As shown in FIG. 3F, the second electrode 250 is formed by CVD or sputtering process to cover the photoelectric transformation layer 230 and the second separation groove 240. A metal layer made of Al or Ag can be used as the second electrode 250.

Figure 3G:
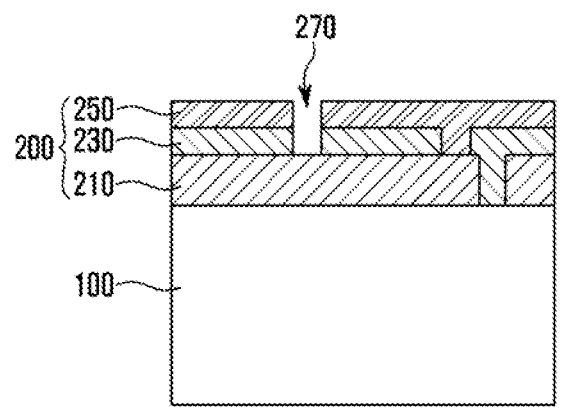

As shown in FIG. 3G, a laser beam is irradiated from the air onto the substrate 100 so that the photoelectric transformation layer 230 and the second electrode 250 are partially removed. As a result, a third separation groove 270 is formed in the photo voltaic layer 230 and the second electrode 250.

Figure 3H:
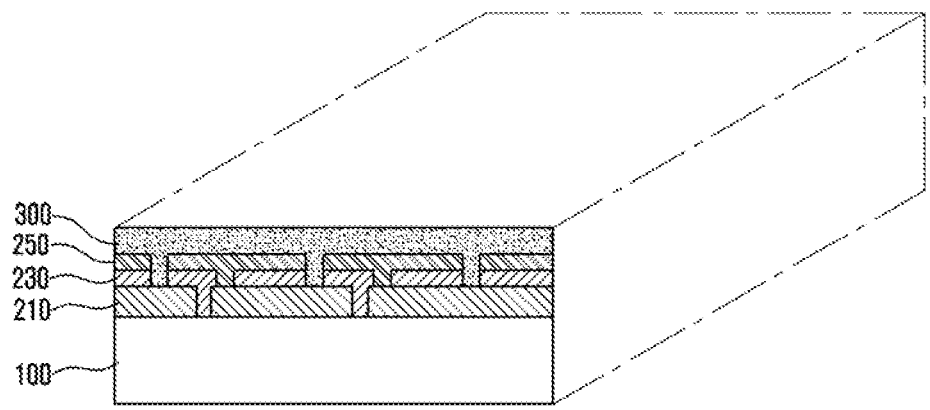

As shown in FIG. 3H, through a lamination process, a protecting layer 300 covers partially or entirely a photovoltaic cell 200 including the photoelectric transformation layer 230, the first electrode 210 and the second electrode 250 so as to protect the photovoltaic cell 200. The protecting layer 300 can include ethylene Vinyl Acetate (EVA).

Through such a process, the photoelectric transformation layer 200 having the protecting layer 300 formed thereon is formed. A backsheet (not shown) can be made on the protecting layer.

In the description below, a method of manufacturing the light absorbing layer will be described in detail with reference to FIGS. 4-8.

Figure 4:
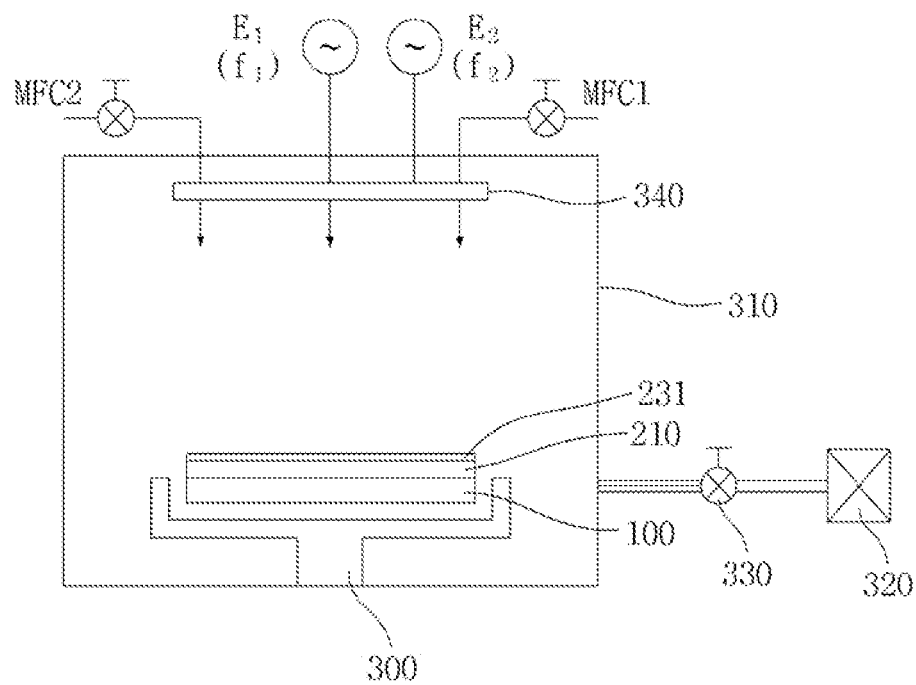
FIG. 4 shows a plasma-enhanced chemical vapor deposition apparatus for forming a light absorbing layer according to an embodiment of the present invention.

FIG. 4 shows a plasma-enhanced chemical vapor deposition apparatus for forming a light absorbing layer according to an embodiment of the present invention. As shown in FIG. 4, the first electrode 210 and the p-type semiconductor layer 231 are formed on the substrate 100. The substrate 100 is disposed on a plate 300 functioning as an electrode.

A vacuum pump 320 operates in order to remove impurities from a chamber 310 before the light absorbing layer forming process. As a result, the impurities in the chamber 310 are removed through an angle valve 330 so that the inside of the chamber 310 is actually in a vacuum state.

When the inside of the chamber 310 is in a vacuum state, source gas such as hydrogen ($H_2$) and silane ($SiH_4$) is introduced to the inside of the chamber 310 through mass flow controllers MFC1 and MFC2 and an electrode 340 having a nozzle formed therein. For example, the hydrogen can be introduced to the chamber 310 by flowing it through a first mass flow controller MFC1. The Silane can be introduced to the chamber 310 by flowing it through a second mass flow controller MFC2. The hydrogen is introduced to the chamber in order to dilute the silane and reduce the Staebler-Wronski effect.

In this case, the first mass flow controller MFC1 and the second mass flow controller MFC2 are controlled to maintain the flow rates of hydrogen and silane constant. The angle valve 330 is also controlled to maintain a constant pressure within the chamber 310.

When the source gases are introduced to the chamber 310 and a first electric power source E1 supplies a voltage having a first frequency f1 to the electrode 340 and a second electric power source E2 supplies a voltage having a second frequency f2 to the electrode 340, an electric potential difference is generated between the electrode 340 and the plate 300. As a result, the source gas is in a plasma state, and the light absorbing layer is deposited on the p-type semiconductor layer 231

Figure 5:
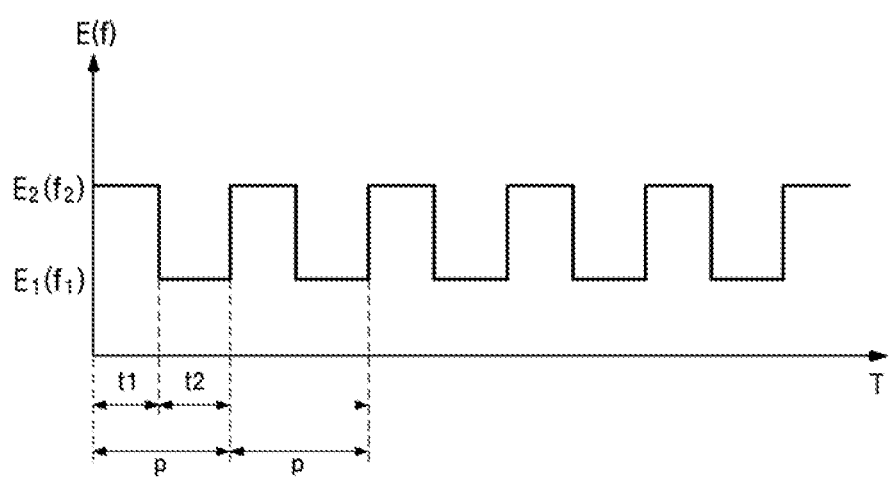
FIG. 5 shows variations of frequencies of a first electric power source and a second electric power source which are supplied to a chamber in order to form a light absorbing layer in accordance with an embodiment of the present invention.

FIG. 5 shows variations of frequencies of the first electric power source E1 and the second electric power source E2 which are supplied to the chamber 310 in order to form a light absorbing layer in accordance with an embodiment of the present invention. The first electric power source E1 supplies a first voltage having the first frequency f1. The second electric power source E2 supplies a second voltage having the second frequency f2. Here, as shown in FIG. 5, the first voltage having the first frequency f1 and the second voltage having the second frequency f2 are alternately supplied to the electrode. A ratio between a time period t1 for supplying the first voltage and a time period t2 for supplying the second voltage is maintained constant so that the first and second voltages are alternately applied for equal time periods.

As described above, the flow rates of hydrogen and silane, the pressure of the chamber 310 and a ratio between the time periods for supplying voltages having mutually different frequencies are maintained constant. Furthermore, a hydrogen dilution ratio in the chamber 310, that is, a ratio of a flow rate of silane to a flow rate of hydrogen is also maintained constant.

As such, since the hydrogen dilution ratio is maintained constant, a vortex caused by the variations of the flow rates of hydrogen and silane is prevented from being generated in the chamber 310. Particularly, if the chamber 310 is used for manufacturing a large area photovoltaic device, there is an increasing possibility of generating a vortex caused by the source gas. Therefore, it is easier to manufacture the large area photovoltaic device by maintaining the constant pressure of the chamber and the constant flow rates of hydrogen and silane.

Figure 6:
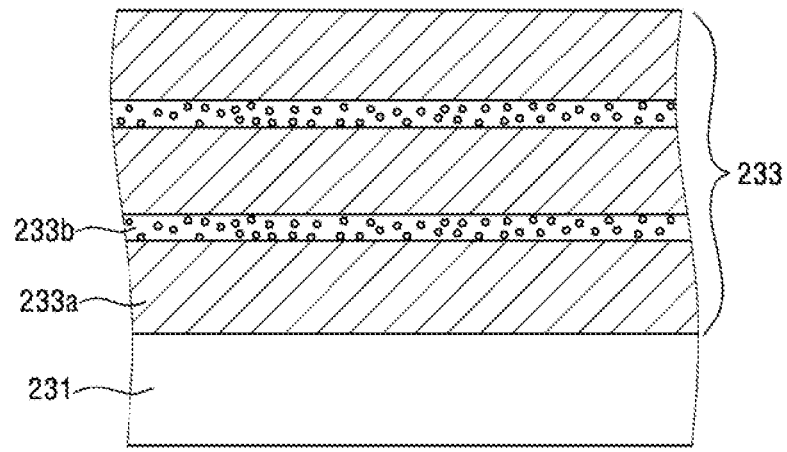
FIG. 6 shows a light absorbing layer including a plurality of sub-layers included in an embodiment of the present invention.

Meanwhile, as shown in FIG. 6, the light absorbing layer 233 including a plurality of the sub-layers 233A and 233B is formed on the p-type semiconductor layer 231. That is, when the first voltage having the first frequency f1 lower than the second frequency f2 is supplied to the electrode, the first sub-layer 233A which is deposited relatively slowly is formed. The first sub-layer 233A includes amorphous silicon. When the second voltage having the second frequency f2 which is greater than the first frequency f1 is supplied to the electrode, the second sub-layer 233B which is deposited relatively rapidly is formed. The second sub-layer 233B includes a crystalline silicon grain.

The higher the frequency is, the higher a plasma density is. Therefore, a deposition rate increases and an electron temperature decreases. As a result, ion damages on a thin film surface or an interface are reduced, making it easier to grow a crystal.

The first sub-layer 233A corresponds to a hydrogenated amorphous silicon based sub-layer (a-Si:H) including amorphous silicon. The second sub-layer 233B corresponds to a hydrogenated proto-crystal line silicon sub-layer (pc-Si:H) including a crystalline silicon grain. The hydrogenated proto-crystalline silicon is produced during the process of a phase change of the amorphous silicon progress to micro-crystalline silicon.

As such, when the light absorbing layer 233 including a plurality of the sub-layers 233A and 233B is made, the degradation rate, i.e., a difference between an initial efficiency and a stabilization efficiency, is reduced. Accordingly, the photovoltaic device according to the embodiment of the present invention can have a high stabilization efficiency.

Figure 7:
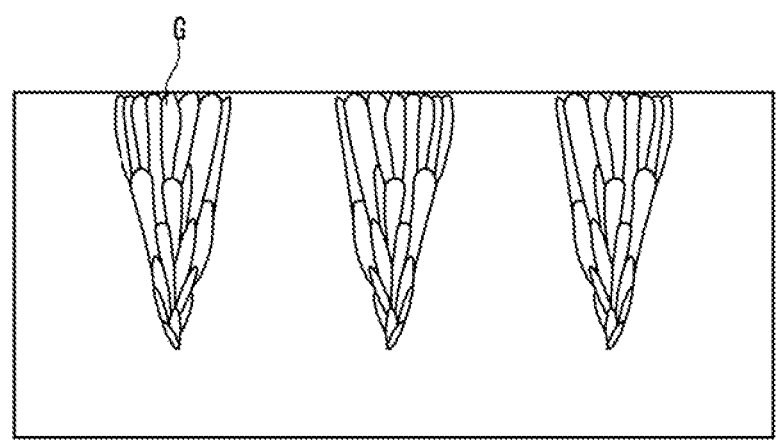
FIG. 7 shows a light absorbing layer consisting of a protocrystalline silicon layer.

In other words, the first sub-layer 233A made of an amorphous silicon based material prevents columnar growth of the crystalline silicon grain of the second sub-layer 233B. As shown in FIG. 7, when the light absorbing layer is formed of only a proto-crystalline silicon layer unlike the embodiment of the present invention, the columnar growth of the crystalline silicon grain is accomplished. That is to say, as deposition is performed, the diameter of the crystalline silicon grain G is increased.

Such a columnar growth of the crystalline silicon grain increases not only a recombination rate of a carrier such as an electron hole or an electron, but also a time required for the efficiency of the photovoltaic device to reach the stabilization efficiency by crystalline silicon grains having non-uniform diameter. The stabilization efficiency of the photovoltaic device is also reduced.

However, in the case of the light absorbing layer 233 including a plurality of sub-layers 233A and 233B in the embodiment of the present invention, since a short-range-order (SRO) and a medium-range-order (MRO) are improved, the degradation of the light absorbing layer 233 is rapid and the stabilization efficiency is increased.

The amorphous silicon of the first sub-layer 233A prevents columnar growth of the crystalline silicon grain, causing the crystalline silicon grains of the second sub-layer 233B to have a uniform diameter. Accordingly, a time required for the efficiency of the photovoltaic device to reach the stabilization efficiency is reduced and a high stabilization efficiency is obtained. Besides, the hydrogen dilution ratio which is actually maintained constant in the chamber 310 during a deposition time also causes the crystalline silicon grains of the second sub-layer 233B to have a uniform diameter. Accordingly, a time required for the efficiency of the photovoltaic device to reach the stabilization efficiency is reduced and a high stabilization efficiency is obtained.

The crystalline silicon grains of the second sub-layer 233B are covered with amorphous silicon based material and separated from each other. The separated crystalline silicon grain performs a core function of radioactive recombination of a part of captured carriers, preventing photocreation of dangling bond. This reduces non-radioactive recombination of the amorphous silicon based material, which surrounds the crystalline silicon grains, of the second sub-layer 233B.

As described above, in the embodiment of the present invention, a plasma-enhanced chemical vapor deposition method is used instead of photo-CVD. The photo-CVD is not suitable for manufacturing a large area photovoltaic device. Also, as deposition is performed, a thin film is deposited on a quartz window of a photo-CVD device, reducing UV light transmitting the quartz window.

For this reason, a deposition rate is gradually reduced and the thicknesses of the first sub-layer 233A and the second sub-layer 233B are gradually reduced. Contrarily, the plasma-enhanced chemical vapor deposition method can solve the defects of the photo-CVD.

Figure 8:
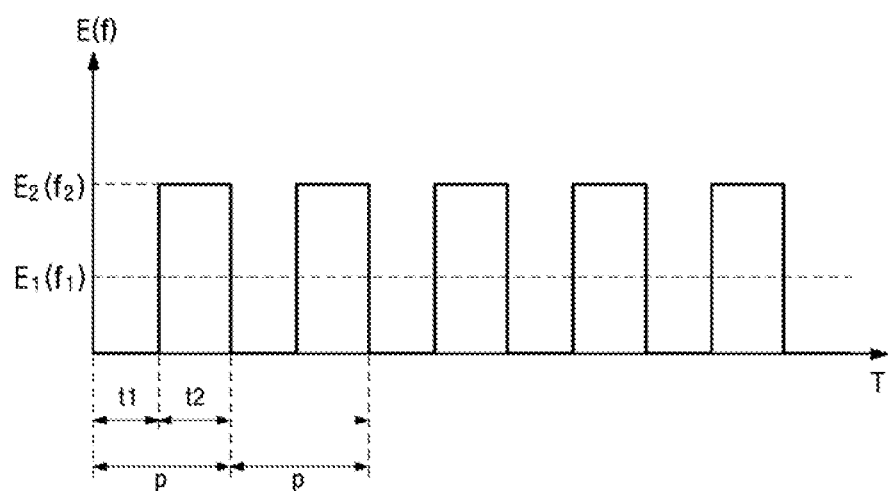
FIG. 8 shows other variations of frequencies of a first electric power source and a second electric power source which are supplied to a chamber in order to form a light absorbing layer in accordance with an embodiment of the present invention.

FIG. 8 shows other variations of frequencies of a first electric power source and a second electric power source which are supplied to a chamber in order to form a light absorbing layer in accordance with an embodiment of the present invention.

As shown in FIG. 8, the voltage having the first frequency f1 is continuously supplied to the electrode during the deposition time. The voltage having the second frequency f2 higher than the first frequency f1 is alternately supplied to the electrode. As a result, the deposition time includes a time period t1 for supplying the voltage having the first frequency f1 and a time period t2 for supplying the voltages having the first frequency f1 and the second frequency f2.

When the first voltage having the first frequency f1 lower than the second frequency f2 is supplied by supplying a voltage according to a frequency variation shown in FIG. 8, the first sub-layer 233A which is deposited relatively slowly is formed. The first sub-layer 233A includes amorphous silicon. When the second voltage having the second frequency f2 higher than the first frequency f1 is supplied with the first voltage to the electrode, the first sub-layer 233A which is deposited relatively rapidly is formed. The first sub-layer 233A includes a crystalline silicon grain.

As such, since the light absorbing layer 233 including the first and the second sub-layers 233A and 233B is made, the degradation rate, i.e., a difference between an initial efficiency and a stabilization efficiency, is reduced. Accordingly, the photovoltaic device according to the embodiment of the present invention can have a high stabilization efficiency.

When a voltage is supplied according to a frequency variation shown in FIG. 5, it is required that a starting point of time for the supply of the first voltage having the first frequency f1 and a stopping point of time for the supply of the second voltage should be appropriately matched to each other. Also, it is required that the stopping point of time for the supply of the first voltage and the starting point of time for the supply of the second voltage should be appropriately matched to each other.

On the contrary, when a voltage is supplied according to a frequency variation shown in FIG. 8, the first voltage having the relatively low first frequency f1 is supplied during the deposition time. Also, the start and stop of the supply of the second voltage having the second frequency f2 are alternately performed. As a result, unlike FIG. 5, it is possible to reduce the burden of matching the start and stop of the supply of the first voltage to those of the second voltage.

In the embodiment of the present invention, the first frequency f1 can be equal to or more than 13.56 MHz. The second frequency f2 is higher than the first frequency f1

In the embodiment of the present invention, a thickness of the first sub-layer 233A made of amorphous silicon can be equal to or more than 10 nm. A sum of the thickness of the first sub-layer 233A and the thickness of the second sub-layer 233B, which are formed during one cycle P, can be equal to or less than 50 nm. In a preferable embodiment, the sum is less than 30 nm.

Here, during more than three cycles P, the thickness of the light absorbing layer 233 including the first and the second sub-layers 233A and 233B can be equal to or more than 150 nm and equal to or less than 350 nm.

For example, if a sum of the thickness of the first sub-layer 233A and the thickness of the second sub-layer 233B, which are formed during one cycle P, is 50 nm, a light absorbing layer 233 can be formed, which has a thickness of 150 nm in three cycles and includes three first sub-layers 233A and three second sub-layers 233B.

During a time period less than three cycles, a light absorbing layer 233 having a thickness equal to or more than 150 nm and equal to or less than 350 nm is formed. The thickness of the first sub-layer 233A made of amorphous silicon layers is excessively increased. As a result, recombinations in the amorphous silicon layer are increased, degrading a stabilization efficiency.

A diameter of a crystalline silicon grain can be equal to or more than 3 nm and equal to or less than 10 nm. It is difficult to form a crystalline silicon grain having a diameter less than 3 nm while reducing the degradation rate reduction effect of the solar cell. If the crystalline silicon grain has a diameter greater than 10 nm, the volume of grain boundary in the circumference of the crystalline silicon grain is excessively increased. As a result, the crystalline silicon grain is also increasingly recombined with each other, thereby reducing the efficiency.

When such a light absorbing layer is included in a top cell of a single junction photovoltaic device or a multiple junction tandem photovoltaic device, an optical band gap of the light absorbing layer can be equal to or more than 1.85 eV and equal to or less than 2.0 eV. The top cell corresponds to a photoelectric transformation layer on which light is first incident when the photovoltaic device includes a plurality of the photoelectric transformation layers.

To form the crystalline silicon grain generates a quantum effect caused by quantum dots. The light absorbing layer 233 according to the embodiment of the present invention has hereby a large optical band gap which is equal to or more than 1.85 eV and equal to or less than 2.0 eV. If the optical band gap is equal to or more than 1.85 eV, it is possible for the light absorbing layer to absorb light with a short wavelength having a high energy density. If the optical band gap is greater than 2.0 eV, the light absorbing layer 233 including the plurality of sub-layers 233A and 233B is difficult to form and absorption of light is reduced. Therefore, the efficiency can be reduced by reduction of a short-circuit current.

An average hydrogen content of the light absorbing layer 233 including a plurality of the sub-layers 233A and 233B can be equal to or more than 15 atomic % and equal to or less than 25 atomic %. If the average hydrogen content of the light absorbing layer 233 is less than 15 atomic %, the size and density of the quantum dot are reduced, and then the optical band gap of the light absorbing layer 233 can be reduced and the degradation rate of the light absorbing layer 233 can be increased. If the average hydrogen content of the light absorbing layer 233 is greater than 25 atomic %, the diameter of the crystalline silicon grain is excessively increased so that a volume of unstable amorphous silicon is also increased. Accordingly, the degradation rate can be increased.

In forming the light absorbing layer 233, source gases, for example, oxygen, carbon or germanium as well as hydrogen and silane can be introduced to the chamber 310. Here, a flow rate of the source gas such as oxygen, carbon or germanium can be maintained constant during the deposition time. As the flow rate of the source gas such as oxygen, carbon or germanium can be maintained constant, a quality of film of the first sub-layer 233A and a film characteristic of the second sub-layer 233B can be maintained to an appropriate and constant level.

When oxygen is introduced to the chamber 310, the first sub-layer 233A and the second sub-layer 233B include hydrogenated amorphous silicon oxide (i-a-SiO:H). The crystalline silicon grain of the second sub-layer 233B is surrounded by the hydrogenated amorphous silicon oxide. When the light absorbing layer 233 including a plurality of the sub-layers 233A and 233B is formed by a flow of oxygen, the thickness of the light absorbing layer 233 is equal to or more than 150 nm and is equal to or less than 300 nm. An average oxygen content of the light absorbing layer 233 can be equal to or more than 0 atomic % and is equal to or less than 3 atomic %. An optical band gap of the light absorbing layer 233 can be equal to or more than 1.85 eV and is equal to or less than 2.1 eV.

When carbon is introduced to the chamber 310, the first sub-layer 233A and the second sub-layer 233B include hydrogenated amorphous silicon carbide (i-a-SiC:H). The crystalline silicon grain of the second sub-layer 233B is surrounded by the hydrogenated amorphous silicon carbide. When the light absorbing layer 233 including a plurality of the sub-layers 233A and 233B is formed by a flow of carbon, the thickness of the light absorbing layer 233 is equal to or more than 150 nm and is equal to or less than 300 nm. An average carbon content of the light absorbing layer 233 can be equal to or more than 0 atomic % and is equal to or less than 3 atomic %. An optical band gap of the light absorbing layer 233 can be equal to or more than 1.85 eV and is equal to or less than 2.1 eV.

If the optical band gap of the light absorbing layer 233 formed by a flow of hydrogen or carbon is equal to or more than 1.85 eV, the light absorbing layer 233 can absorb a lot of light with a short wavelength having a high energy density. If the optical hand gap of the light absorbing layer 233 is greater than 2.1 eV, the light absorbing layer 233 including the plurality of sub-layers 233A and 233B is difficult to form and absorption of light is reduced. Therefore, the efficiency can be reduced by reduction of a short-circuit current.

When an average oxygen content or an average carbon content of the light absorbing layer 233 formed by a flow of oxygen or carbon is greater than 3 atomic %, the optical band gap of the light absorbing layer 233 is rapidly increased and a dangling bond density is suddenly increased. As a result, the short-circuit current and a fill factor (FF) are reduced, so that the efficiency is degraded.

As such, the light absorbing layer 233 formed by a flow of oxygen or carbon can be included in the top cell of a multiple junction photovoltaic device.

When germanium is introduced to the chamber 310, the first and the second sub-layers 233A and 233B include hydrogenated amorphous silicon germanium (i-a-SiGe:H). The crystalline silicon grain of the second sub-layer 233B is surrounded by the hydrogenated amorphous silicon germanium. When the light absorbing layer 233 including a plurality of the sub-layers 233A and 233B is formed by a flow of germanium, the thickness of the light absorbing layer 233 is equal to or more than 300 nm and is equal to or less than 1000 nm. An average germanium content of the light absorbing layer 233 can be equal to or more than 0 atomic % and is equal to or less than 20 atomic %. An optical band gap of the light absorbing layer 233 can be equal to or more than 1.3 eV and is equal to or less than 1.7 eV. If the optical band gap of the light absorbing layer 233 formed by a flow of germanium is equal to or more than 1.3 eV and is equal to or less than 1.7 eV, the deposition rate of the light absorbing layer 233 is prevented from being rapidly reduced and the dangling bond density and a recombination are reduced. Therefore, the efficiency is prevented from being degraded.

If an average germanium content of the light absorbing layer 233 formed by a flow of germanium is greater than 20 atomic %, the deposition rate of the light absorbing layer 233 is rapidly reduced and a recombination is increased by the increase of the dangling bond density. Consequently, the short-circuit current, the fill factor (FF) and the efficiency are reduced.

Meanwhile, when the light absorbing layer 233 is formed by a flow of oxygen, carbon or germanium, the average hydrogen content of the light absorbing layer 233 can be equal to or more than 15 atomic % and equal to or less than 25 atomic %.

Thus, the light absorbing layer 233 formed by a flow of germanium can be included in either a bottom cell of a double junction photovoltaic device including two photoelectric transformation layers 230 or a middle cell of a triple junction photovoltaic device including three photoelectric transformation layers 230.

That is to say, since the optical band gap of the light absorbing layer 233 formed by a flow of germanium is equal to or more than 1.3 eV and is equal to or less than 1.7 eV, and thus, is less than an optical band gap, which is equal to or more than 1.85 eV and equal to or less than 2.0 eV, of the light absorbing layer 233 used in the top cell. Accordingly, the light absorbing layer 233 formed by a flow of germanium can be used in either the bottom cell of the double junction photovoltaic device or the middle cell of the triple junction photovoltaic device including three photoelectric transformation layers 230.

The average germanium content is equal to or more than 0 atomic % and equal to or less than 20 atomic %. Therefore, since there is a possibility that the average germanium content may be greater than the average oxygen content or the average carbon content, the deposition rate can be reduced. Accordingly, the first frequency f1 can be equal to or more than 27.12 MHz, greater than 13.56 MHz. The increased first frequency f1 improves a deposition rate and causes the quantum dots to be easily formed.

The foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such limitation is not intended to be interpreted under 35 USC 112(6).

What is claimed is:

1. A method of manufacturing a photovoltaic device, the method comprising:
forming a first electrode on a substrate;
forming at least one photoelectric transformation layer on the first electrode in a chamber, the photoelectric transformation layer comprising a light absorbing layer, the light absorbing sub-layer comprising at least two pairs of a first sub-layer and a second sub-layer which are alternately stacked;

forming a second electrode on the photoelectric transformation layer;
wherein a hydrogen dilution ratio of each of source gases which are flown to the chamber is constant while the light absorbing layer is formed; and
wherein, while the light absorbing layer is formed, a first voltage having a first frequency and a second voltage having a second frequency higher the first frequency are alternately supplied to an electrode having a nozzle formed therein in the chamber,
wherein the first sub-layer, comprising hydrogenated amorphous silicon, is formed during a time period for supplying the first voltage, and the second sub-layer, comprising hydrogenated proto-crystalline silicon comprising a crystalline silicon grain, is formed during a time period for supplying the second voltage.

2. The method of claim 1, wherein a pressure of the chamber is constant while the light absorbing layer is formed.

3. The method of claim 1, wherein a ratio of a time period for supplying the first voltage to a time period for supplying the second voltage is maintained constant.

4. The method of claim 1, wherein the first frequency is equal to or more than 13.56 MHz.

5. The method of claim 1, wherein a thickness of the light absorbing layer is equal to or more than 150 nm and equal to or less than 350 nm.

6. The method of claim 1, wherein a thickness of the first sub-layer is equal to or more than 10 nm.

7. The method of claim 1, wherein a diameter of the crystalline silicon grain is equal to or more than 3 nm and equal to or less than 10 nm.

8. The method of claim 1, wherein thickness of the first sub-layer and the second sub-layer which are formed during one cycle are equal to or less than 50 nm.

9. The method of claim 1, wherein an optical band gap of the light absorbing layer is equal to or more than 1.85 eV and equal to or less than 2.0 eV.

10. The method of claim 1, wherein, when the light absorbing layer is formed, oxygen, carbon or germanium are flown to the chamber.

11. The method of claim 1, wherein, when the light absorbing layer is formed, oxygen, carbon or germanium are flown to the chamber, and wherein flow rates of the oxygen, carbon or germanium are maintained constant during a deposition time.

12. The method of claim 1, wherein, when the light absorbing layer is formed, oxygen, carbon or germanium are flown to the chamber, and wherein the light absorbing layer is comprised in a photoelectric transformation layer which is closest to a light incident side among a plurality of the photoelectric transformation layers.

13. The method of claim 1, wherein an average hydrogen content of the light absorbing layer is equal to or more than 15 atomic % and equal to or less than 25 atomic %.

14. The method of claim 1, wherein, when the light absorbing layer is formed, oxygen, carbon or germanium are flown to the chamber, and wherein an average hydrogen content of the light absorbing layer is equal to or more than 15 atomic % and equal to or less than 25 atomic %.

15. The method of claim 1, wherein, when the light absorbing layer is formed, oxygen or carbon is flown to the chamber, and wherein an average oxygen content or an average carbon content of the light absorbing layer is equal to or more than 0 atomic % and equal to or less than 3 atomic %.

16. The method of claim 1, wherein, when the light absorbing layer is formed, oxygen or carbon is flown to the chamber, and wherein an optical band gap of the light absorbing layer is equal to or more than 1.85 eV and equal to or less than 2.1 eV.

17. The method of claim 1, wherein, when the light absorbing layer is formed, germanium is flown to the chamber, and wherein an average germanium content of the light absorbing layer is equal to or more than 0 atomic % and equal to or less than 20 atomic %.

18. The method of claim 1, wherein, when the light absorbing layer is formed, germanium is flown to the chamber, and wherein an optical band gap of the light absorbing layer is equal to or more than 1.3 eV and equal to or less than 1.7 eV.

19. The method of claim 1, wherein, when the light absorbing layer is formed, germanium is flown to the chamber, and wherein the first frequency is equal to or more than 27.12 MHz.

20. A method of manufacturing a photovoltaic device, the method comprising:
forming a first electrode on a substrate;
forming at least one photoelectric transformation layer on the first electrode in a chamber, the photoelectric transformation layer comprising a light absorbing layer, the light absorbing sub-layer comprising at least two pairs of a first sub-layer and a second sub-layer which are alternately stacked;
forming a second electrode on the photoelectric transformation layer;
wherein flow rates of hydrogen and silane which are flown to the chamber are constant while the light absorbing layer is formed; and
wherein, while the light absorbing layer is formed, a first voltage having a first frequency is continuously supplied to an electrode having a nozzle formed therein in the chamber, and wherein a second voltage having a second frequency higher the first frequency is alternately supplied to the electrode,
wherein the first sub-layer comprising hydrogenated amorphous silicon is formed during a time period for supplying the first voltage and not supplying the second voltage, and the second sub-layer comprising hydrogenated proto-crystalline silicon comprising a crystalline silicon grain is formed during a time period for supplying the first voltage and the second voltage together.

21. The method of claim 20, wherein a pressure of the chamber is constant while the light absorbing layer is formed.

22. The method of claim 20, wherein a ratio between a time period for supplying the first voltage and a time period for supplying the second voltage is maintained constant.

23. The method of claim 20, wherein the first frequency is equal to or more than 13.56 MHz.

24. The method of claim 20, wherein a thickness of the light absorbing layer is equal to or more than 150 nm and equal to or less than 350 nm.

* * * * *